219-121 SR
MTR04 XR 3,617,375
[redacted] [redacted] [redacted]

(1)

United States Patent

[11] 3,617,375

[72] Inventors Daniel A. Marek
Irving;
Kurt W. Kreiselmaier, Dallas; James H. Van Tassel, Dallas, all of Tex.

[21] Appl. No. 863,408
[22] Filed Aug. 11, 1969
[45] Patented Nov. 2, 1971
[73] Assignee Texas Instruments Incorporated
Dallas, Tex.
Continuation of application Ser. No. 492,339, Oct. 1, 1965, now abandoned.

[54] ELECTRON BEAM EVAPORATED QUARTZ INSULATING MATERIAL PROCESS
3 Claims, 4 Drawing Figs.

[52] U.S. Cl. .......... 117/217, 117/215, 117/93.1 R, 117/212, 29/576 R, 29/588 R, 29/25.41 R, 29/625 R, 29/627 R, 219/121 EB
[51] Int. Cl. .......... B41m 3/08
[50] Field of Search .......... 29/624–627; 117/212, 215, 217; 219/121 EB

[56] References Cited
UNITED STATES PATENTS

| | | | |
|---|---|---|---|
| 2,932,588 | 4/1960 | Frank | 219/121 EB |
| 3,184,329 | 12/1960 | Burns, Jr. | 117/215 |
| 3,313,013 | 4/1967 | Last | 317/101 A |
| 3,326,717 | 6/1967 | Gregor et al. | 117/93.3 |
| 3,415,680 | 12/1968 | Perri et al. | 117/212 |
| 3,388,000 | 6/1968 | Waters et al. | 117/212 |

*Primary Examiner*—John F. Campbell
*Assistant Examiner*—Robert W. Church
*Attorneys*—Samuel M. Mims, Jr., James O. Dixon, Andrew M. Hassell, Harold Levine, John G. Graham, John E. Vandergriff and Rene E. Grossman

ABSTRACT: Disclosed is a method of forming multilevel electrically conductive interconnections for microminiature devices by electron beam evaporation of a layer of quartz over the first level of interconnections. A second level of interconnections are formed on the quartz layer and make ohmic contact to the first level of interconnections through openings in the quartz layer.

INVENTORS
Daniel A. Marek
Kurt W. Kreiselmaier
James H. Van Tassel

BY John E. Graham
ATTORNEY

INVENTORS
Daniel A. Marek
Kurt W. Kreiselmaier
James H. Van Tassel

BY
ATTORNEY

ELECTRON BEAM EVAPORATED QUARTZ INSULATING MATERIAL PROCESS

This is a continuation application of Ser. No. 492,339, filed Oct. 1, 1965, now abandoned.

This invention relates to insulating material, and more particularly to the type of insulating material used for electrically isolating multilevel conductors upon microminiature devices.

Within the electronics field, and particularly within the field of microelectronics, it is often necessary to fabricate devices having a considerable number of conductive leads and interconnections upon these devices. For example, magnetic thin film memory cells have a matrix of parallel and intersecting strip lines upon their surfaces, and both monolithic and hybrid integrated circuit networks have a large number of leads and interconnections interconnecting selected components of the network to provide the desired circuit functions.

Due to the considerable number of these leads and interconnections, it is often necessary for one or more leads to cross over the others. This requires that a layer of insulating material be applied over the first lead layer, adhering to it and effectively insulating the first layer from the second layer.

Earlier attempts to provide a suitable insulating material have been plagued by the fact that the insulating layer is not continuous, due to a large number of pinholes within the layer. These pinholes result in shorts between the various layers of connections, as well as to the substrate over which the connections are deposited. Various organic materials that have been investigated for use as the insulating layers appear to have a lower incidence of pinholes than some of the inorganic materials, but these organics are not stable enough to withstand long term, high temperature operations.

With these aforementioned requirements and difficulties in mind, it is an object of this invention to provide an improved insulation material between various levels of conductive leads and interconnections, the primary requirements of the material being that it should have a low incidence of pinholes, stability when submitted to high temperature operation for long terms, a high dielectric constant and may be selectively removed by conventional photomask etching techniques. It is a more particular object to provide such a material for use with evaporated leads upon microminiature devices such as thin film components, magnetic film memory cells, integrated circuits and the like.

In accordance with these and other objects, the present invention involves the electron-beam evaporation of quartz upon a first layer of conductive leads which have been deposited, usually by evaporation, on a substrate. The electron beam evaporated quartz serves as an insulator between a second layer of conductive leads and interconnections deposited upon the quartz. The electron beam evaporated quartz may also be utilized to provide insulation, where required, between the first level of leads and the subtrate itself.

A more detailed description of the invention, as well as the advantages thereof, follows, taken in conjunction with the accompanying drawing, while the novel features believed characteristic of the invention are set forth in the appended claims. With respect to the drawing:

Figure 1:
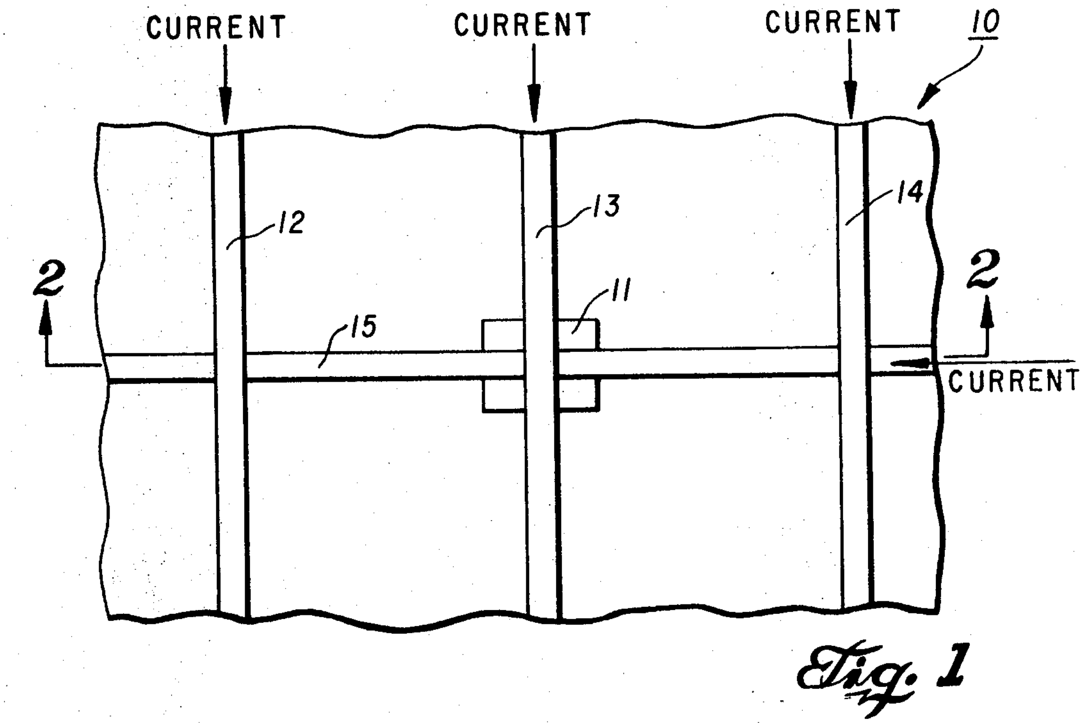
FIG. 1 is a plan view of a magnetic film showing two levels of striplines.

Referring now to FIG. 1, there is depicted a top view of a portion of a magnetic thin film memory cell 10 showing a single ferromagnetic film bit 11 composed of Permalloy, a nickel-iron alloy, for example. Only one bit is illustrated, although many such elements would be ordinarily utilized in an integrated array. The film may be perhaps 1,000 A thick, and about 50×80 mils in area. Two mutually perpendicular strip-line current carrying conductors 13 and 15 pass over the film bit 11, while the conductors 12 and 14 pass over the strip-line 15, as well as over other magnetic film bits, not shown.

Figure 2:
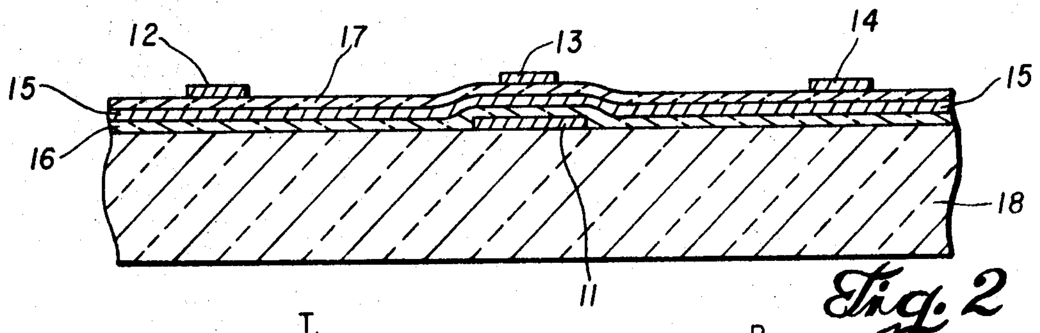
FIG. 2 is a sectional view of the magnetic thin film memory cell of FIG. 1, taken along section line 2—2, the insulating material of the invention electrically isolating the two levels from each other and from the substrate.

Looking at the cross section of the cell 10 as depicted in FIG. 2, the magnetic film bit 11 is shown formed upon an insulating substrate 18, composed of glass, for example. The insulating layer 16 electrically isolates the strip-line 15 from the film bit 11, while the insulating layer 17 electrically isolates the second level conductive strips 12, 13 and 14 from the conductive strip 15. Both insulating layer 16 and 17 are formed by the electron-beam evaporation of quartz, the process hereinafter described.

Figure 3:
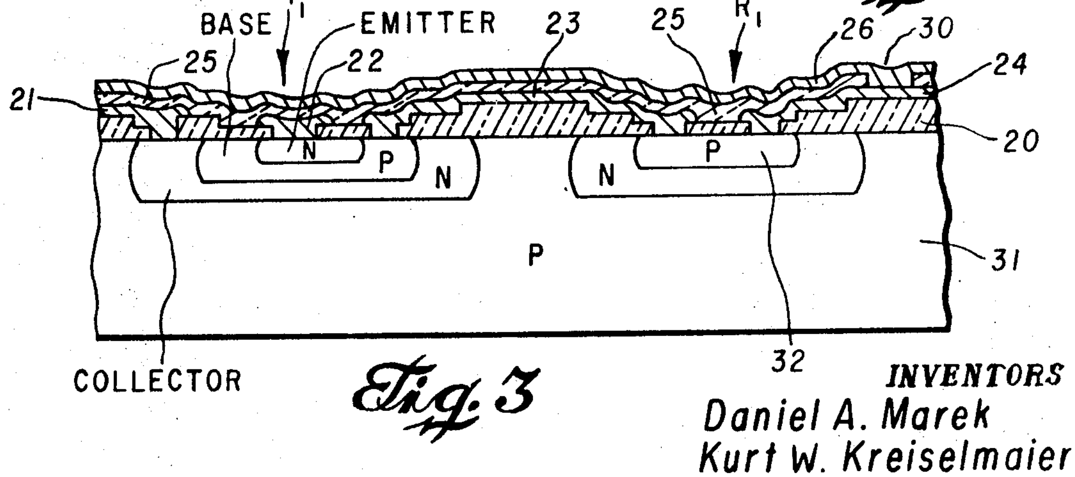
FIG. 3 is a sectional view of a portion of an integrated circuit with two levels of leads and interconnections insulated from each other by electron beam evaporated quartz.

Referring now to FIG. 3, a sectional view of a portion of an integrated circuit is shown, an NPN transistor $T_1$ and resistor $R_1$ having been formed by diffusion in the P-type substrate 31. A P-type diffused region provides the base of the transistor, while an elongated P-type region 32 formed simultaneously with the base provides the resistor $R_1$. N-type diffused regions also provide the collector and emitter of the transistor $T_1$, as shown. The diffusion operations utilize silicon oxide masking so that an oxide layer 20 acquires a stepped configuration, as indicated.

Openings are made in the oxide layer 20 where contact is necessary and metal film or films are deposited over the oxide and within the openings and selectively removed to provide the desired first-level leads and interconnections. For example, the leads 21 and 22 contact the N-type collector and the N-type emitter, respectively while the interconnection 23 connects one end of the resistor $R_1$ to the P-type base region of the transistor $T_1$. The lead 24 connects the other end of the resistor $R_1$ to the second-level interconnector 26 at the location 30, this second-level interconnector 26 ohmically connecting other portions of the integrated circuit network not shown. Before the deposition of the second-level interconnector 26 by conventional techniques, an insulating layer 25 of electron beam evaporated quartz is formed over the first-level leads and interconnections, this insulating layer electrically isolating the two levels of interconnectors. Using conventional photographic and etching techniques, a portion of the quartz layer 25 is selectively removed to form an opening at the location 30 to enable the subsequently deposited conductive film 26 to make ohmic contact to the exposed portion of the conductive film 24.

Figure 4:
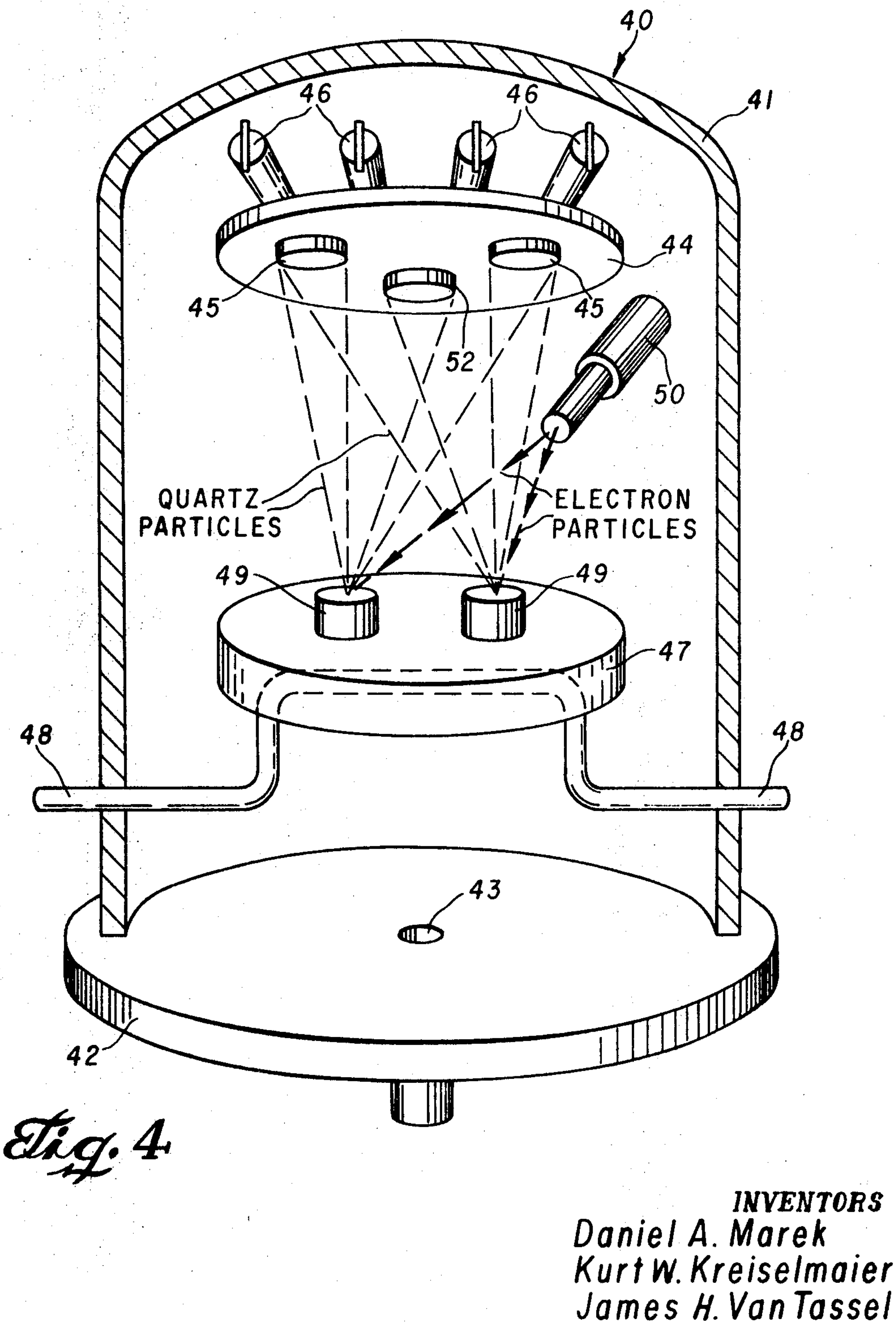
FIG. 4 is a schematic representation of one form of apparatus suitable for depositing the insulating material of this invention.

Referring now to FIG. 4, there is described in connection therewith one method for the deposition of electron beam evaporated quartz for use as the insulating layers above described with reference to the devices illustrated in FIGS. 1–3. The apparatus used for this description includes an evaporation chamber 40 which comprises a bell jar 41 mounted on a base plate 42. An opening 43 in the baseplate is connected to a vacuum pump (not shown) for evacuating the chamber. A platform 44 with a conventional jig on its lower face is mounted above the baseplate 42 by means not shown, and serves as a work holder for a plurality of substrates 45, upon the lower faces of which the evaporated quartz is to be deposited. These substrates 45 may be, for example, memory cells such as those described with reference to FIGS. 1 and 2, with the film bits formed on their surfaces, or they may be semiconductor slices with individual interconnected components formed within their faces, such as the transistor $T_1$ and resistor $R_1$ described with reference to FIG. 3, before the deposition of the second-level interconnections. In the former case, the electron beam evaporation of the quartz will form the insulating layer between the levels of strip lines; in the latter case the evaporated quartz will form the insulating layer between the first and second level interconnections.

Above the platform 44 a bank of quartz infrared tubes 46 is positioned, these functioning to heat the platform and the substrates to a selected temperature, and maintain them at the selected temperature with a fair degree of precision for the duration of the evaporation. A suitable temperature control, including a thermocouple with a feedback arrangement (not shown) is provided for this purpose.

Approximately 14 inches to 15 inches below the platform 44, a block 47 of copper, for example, is mounted with pipes 48 so connected as to water cool the block 47. Upon this block, a number of quartz cylinders 49 are placed, the cylinders being approximately 1 to 1 ½ inches in diameter and approximately 1 inch in length. An electron gun 50 of conventional type is located 8 to 10 inches from the block 47 and focused upon the quartz cylinders 49 upon the block 47.

The chamber 40 is initially evacuated to a pressure of about $10^{15}$ mm. of mercury. With the substrates 45 in place and a vacuum pulled, the infrared tubes 46 are energized to bring the temperature of the platform 44 and and substrates 45 up to between 200°–400° C. The temperature to which the substrates are raised depends primarily upon the type of metallized leads that are upon the substrate, since undesirable alloying may occur if the eutectic temperature is exceeded. For example, when gold leads are deposited upon the substrate 45, the substrate temperature should preferably not exceed 300° C., while a temperature of approximately 350° C. may be tolerated when aluminum leads are used. The purpose of heating the substrates 45 is to increase the adhesion of the evaporated quartz particles to the surface.

The electron gun 50 is then energized to a suitable power level. For one particular deposition, the gun filament current was set at from 20 to 25 amperes, the beam voltage at from 12 to 15 kilovolts, and the beam current at from 50 to 75 milliamperes. Electron particles then strike the quartz cylinders 49, causing quartz particles to be driven off the surfaces of the cylinders and "evaporate" throughout the evaporation chamber 40. A certain percentage of these quartz particles will strike the surface of the substrate 45 and adhere to the exposed portions. Any conventional technique may be used to control the thickness of the deposition of the quartz layers upon the substrates. In this particular embodiment, however, a quartz crystal 52 of known thickness is initially mounted directly adjacent the substrates 45, and means (not shown) for passing a given voltage through this crystal and also for measuring the change in frequency of vibration of the crystal are attached to the crystal. Since the change in frequency of vibration of the crystal is dependent upon mass deposited on the crystal, it is possible at any given time to determine the thickness of the evaporated quartz layer (density approximately 2.2) upon the crystal 52, and due to the close proximity of the substrates 45, also determine the thickness of the evaporated layer on these substrates. In this manner the thickness of the evaporated quartz layers upon the substrates 45 may be controlled with great precision.

During the deposition of the quartz layer, particles of dust and other contaminants may tend to cause the formation of pinholes at isolated locations in the layer. It may therefore be desirable, as an alternative to evaporating the entire layer at one time, to evaporate a portion of the layer, say one-half the desired thickness, remove the substrate with the evaporated portion from the vacuum chamber, clean the surface of the evaporated layer by buffing or polishing, for example, to remove the contaminants, and thereafter evaporate the remaining portion of the desired quartz layer.

It is to be noted that the function of the block 47 during the electron beam evaporation of the quartz is threefold. First, the block serves as a platform for the quartz cylinders 49; Second, it provides a background target upon which the electron gun beam may be focused; and, third the block, along with the water coils 48, provide a method for dissipating the heat that builds up in the quartz cylinder 49.

Following the procedure previously described, insulating layers of excellent quality have been deposited. For example, in the manufacture of one set of memory cells, a 7,000 A (1 Angstrom = $10^{18}$ cm.) quartz layer was electron beam evaporated upon a first level pattern of twenty-six 0.050 inch wide strip-lines. The layer was then buffed or polished in order to remove dust particles and other contaminants that were upon the surface of the quartz layer, and another 7,000 A of quartz was electron beam evaporated upon the polished surface, resulting in a substantially pinhole free insulating layer. The electron beam evaporated quartz layer has a high dielectric constant (approximately 3.9 at 20° C. and 1 mc.) is able to withstand operating temperatures up to approximately 1,200° C., and may be selectively removed by conventional photographic masking and etching techniques.

Although one form of apparatus has been described for the electron beam evaporation, any other type of apparatus may be utilized, as well as modifications of the described apparatus. Also, the evaporated quartz layer itself, although referred to as the insulating material between two levels of conductive leads, is equally applicable when a larger number of levels are required.

While the invention has been described with reference to specific methods and embodiments, it is to be understood that this description is not to be construed in a limiting sense. Various modifications of the disclosed embodiments, as well as other embodiments of the invention, will become apparent to persons skilled in the art without departing from the spirit and scope of the appended claims.

What is claimed is:

1. In a method of fabricating an electronic device, the steps of:
   a. forming a first conductive film upon a substrate;
   b. electron beam evaporating a first layer of quartz, upon said first film;
   c. cleaning the surface of said first layer of quartz;
   d. electron beam evaporating a second layer of quartz upon the cleaned surface of said first layer of quartz, and
   e. forming a second conductive film upon said second layer of quartz, said first and second layer of quartz electrically isolating said first conductive film from said second conductive film.

2. In a method of fabricating an electronic device, the steps of:
   a. forming a first conductive film upon a substrate;
   b. electron beam evaporating a first layer of quartz upon said first film;
   c. polishing the surface of said first layer;
   d. electron beam evaporating a second layer of quartz upon said cleaned surfaced of said first layer; and
   e. forming a second conductive film upon said second layer of quartz, said first and second layer electrically isolating said first conductive film from said second conductive film.

3. In a method for fabricating an electronic device, the steps of:
   a. forming a first conductive film upon a substrate;
   b. electron beam evaporating a first layer of quartz upon said first film;
   c. buffing the surface of said first layer so as to remove dust particles;
   d. electron beam evaporating a second layer of quartz upon said cleaned surface of said first layer; and
   e. forming a second conductive film upon said second layer of quartz, said first and second layer electrically isolating said first conductive film from said second conductive film.

* * * * *